US006723656B2

(12) United States Patent
Martin

(10) Patent No.: US 6,723,656 B2
(45) Date of Patent: Apr. 20, 2004

(54) METHOD AND APPARATUS FOR ETCHING A SEMICONDUCTOR DIE

(75) Inventor: Kirk Martin, Aptos, CA (US)

(73) Assignee: Nisene Technology Group, Watsonville, CA (US)

( * ) Notice: Subject to any disclaimer, the term of this patent is extended or adjusted under 35 U.S.C. 154(b) by 27 days.

(21) Appl. No.: 09/902,931

(22) Filed: Jul. 10, 2001

(65) Prior Publication Data

US 2003/0013317 A1 Jan. 16, 2003

(51) Int. Cl.[7] .............................................. H01L 21/302
(52) U.S. Cl. ...................... 438/745; 438/106; 438/112; 438/124; 438/748; 438/750
(58) Field of Search ................................ 438/106, 112, 438/124, 128, 459, 745, 748, 750, 756

(56) References Cited

U.S. PATENT DOCUMENTS

| 4,359,360 A | * | 11/1982 | Harris et al. ............ 156/345.18 |
| 4,372,803 A | * | 2/1983 | Gigante ...................... 156/345 |
| 5,064,498 A | * | 11/1991 | Miller .......................... 438/16 |
| 5,252,179 A | * | 10/1993 | Ellerson et al. ............... 216/90 |
| 5,956,142 A | * | 9/1999 | Muller et al. ............... 356/357 |
| 6,238,936 B1 | * | 5/2001 | Yu ................................ 438/7 |

OTHER PUBLICATIONS

Weavers, Barry A., "Chemical Thinning of Silicon for Emission Microscopy Using Multi ETGH—An Introduction," Nisene Technology Group, Inc., B&G International Division, Aug. 2000, pp. 1–6.
Hypervision, "Hypervision's PTF1 Portable Test Floor Emission Microscope," Hypervision Inc., 2000, pp. 1–8.
Hypervision, "Sensor and Optics Technology: BEAMS and Mercad Telluride (MCT)", Hypervision Inc., 2000, pp. 1–8.
Hypervision, "Chip UnZip Backside Preparation Tool," Hypervision Inc., 2000, pp. 1–4.
Hypervision, "Chip UnZip: Low Stress Backside Semiconductor Preparation," Hypervision, 1998, pp. 1–4.
Adams, Tom, "Backside Emission Microscopy of Wafers," News and Analysis @Semiconductor Online, Feb. 28, 2000, pp. 1–3.
Adams, Tom, "Bringing the Emission Microscope to the Test Floor," News and Analysis @Semiconductor Online, Jul. 1, 1999, pp. 1–4.
Hypervision, "BEAMS™ (Backside Emission Analysis Microscope System)", Hypervision Inc., 1998, p. 1.
Clark, Scott, MSCE, "Etching Silicon Dioxide with Aqueous HF Solutions," *Silicon Dioxide Etch*, Bold Technologies, Jan. 29, 2001, pp. 1–5.
Bold Technologies, "Manual Equipment", Bold Technologies, Inc., 1998–2000, pp. 1–3.
Nisene Technology Group, "MultiEtch System," Nisene Technology Group, Inc., Jul. 12, 2000, pp. 1–4.

* cited by examiner

*Primary Examiner*—Lan Vinh
(74) *Attorney, Agent, or Firm*—Patent Law Group LLP; Carmen C. Cook

(57) ABSTRACT

A method and apparatus for etching a semiconductor die are disclosed whereby flowing an etchant material across an inactive thereof thins the semiconductor die. In one embodiment, the etchant includes a mixture of nitric acid, hydrofluoric acid, and acetic acid and turbulently flows from one edge of the semiconductor die, across the inactive surface of the semiconductor die, to an opposing edge of the semiconductor die.

26 Claims, 7 Drawing Sheets

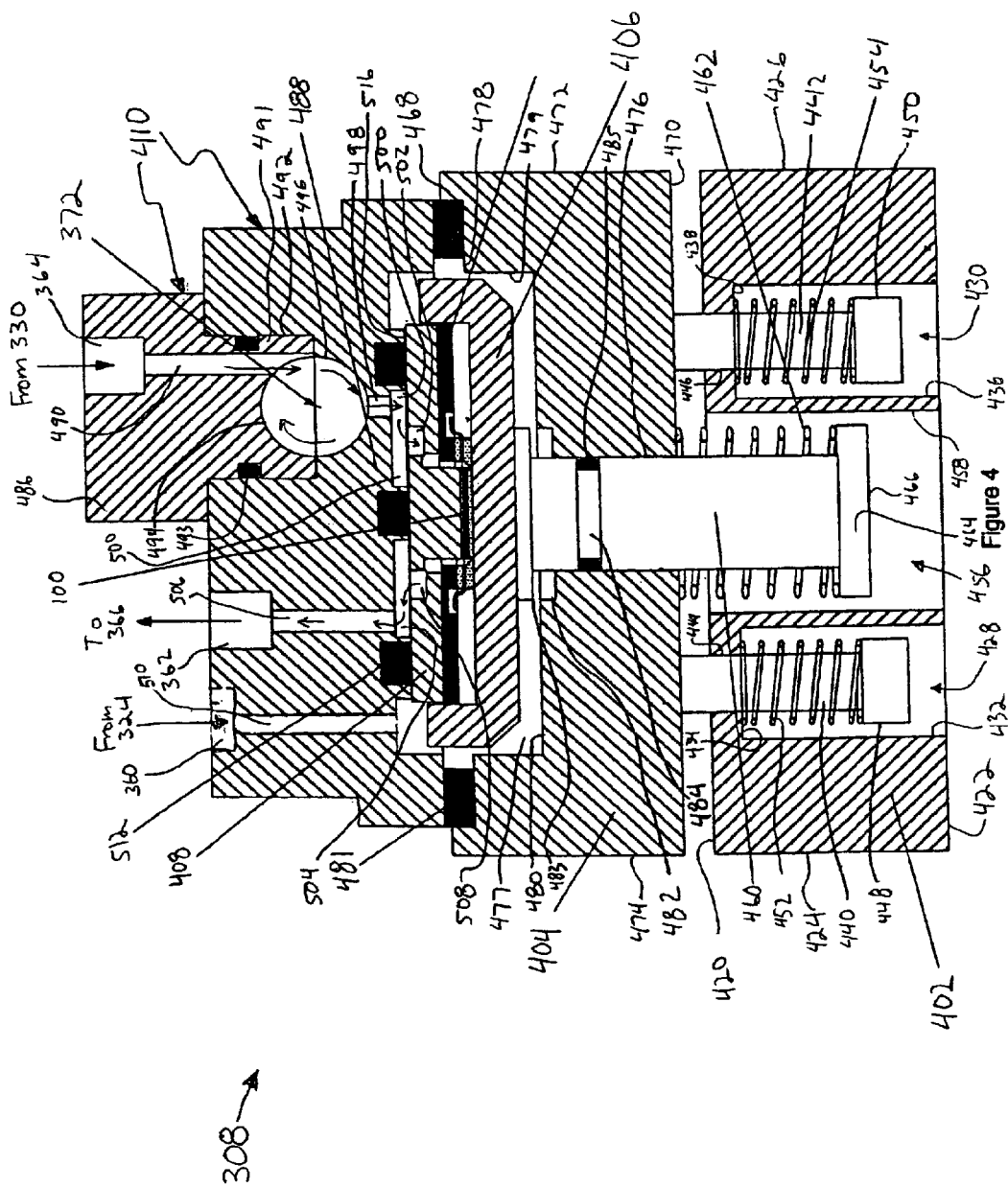

METHOD AND APPARATUS FOR ETCHING A SEMICONDUCTOR DIE

TECHNICAL FIELD

The present invention relates to semiconductor die processing, and more particularly to a method and apparatus for etching semiconductor dies.

BACKGROUND

With imaging technologies such as photon emission microscopy and ultrasonic imaging, it is possible to observe semiconductor die construction and failure mechanisms from the inactive, unprocessed, or "back", side of the semiconductor die. These techniques permit an inspection of the semiconductor die that is not obscured by the metal interconnects typically present on the active, or processed, side of the semiconductor die.

The quality of photon emission microscopy images from the back side of the semiconductor die is generally related to the thickness of the silicon through which the image is taken. The silicon tends to absorb and diffuse light in the imaging range for photon emission microscopy. In ultrasonic imaging, the silicon tends to diffuse the sonic energy. Hence, in general, both photon emission microscopy and ultrasonic imaging techniques tend to produce higher quality images the thinner the silicon. In some applications, it is desirable to thin the semiconductor die to less than about 200 micrometers for p (−) silicon and to less than about 80 micrometers for n (+) silicon. In other applications, it is desirable to thin the die to about 50 micrometers or less.

Mechanical means for thinning semiconductor die tend to be highly time consuming and may damage the semiconductor die during the thinning process. Indeed, mechanical thinning techniques may cause mechanical damage, thermal damage, or both, to the semiconductor die during the thinning process.

Even if the semiconductor die is not broken during the mechanical thinning process, micro-fractures may be formed in the semiconductor die. These micro-fractures may propagate into active areas of the semiconductor die and induce defects therein. The likelihood of semiconductor die damage due to mechanical thinning tends to increase the thinner the semiconductor die.

For packaged semiconductor die where the backside of the semiconductor die is exposed, such as in some "flip-chip" packages, it is possible to thin the semiconductor die using conventional lapping and chemical-mechanical polishing techniques, which tend to be relatively time consuming, and may also damage the semiconductor die.

In circumstances where the semiconductor die is disposed within a plastic package, the backside of the plastic package is conventionally machined to expose the backside of the semiconductor die through a package cavity. This typically requires machining through the plastic encapsulant, the die attach paddle, and the die attach adhesive, such as with a milling tool.

The semiconductor die may alternatively be disposed within a ceramic semiconductor package. Pursuant to this embodiment, a cavity is formed in the ceramic semiconductor package adjacent the inactive surface of the semiconductor die to expose the same through the cavity.

After the backside of the semiconductor die has been exposed through the semiconductor package, a pointed lapping tool may be used to thin the die by grinding and polishing the backside of the semiconductor die within the package cavity.

A need exists for an improved method and apparatus for thinning a semiconductor die. An additional need exists for a method and apparatus for thinning a semiconductor die disposed within a semiconductor package.

SUMMARY

In accordance with one embodiment of the present invention, a semiconductor die is etched by flowing a layer of etchant across an exposed surface of the die from a first edge of the semiconductor die to a second edge of the semiconductor die.

An apparatus is provided for etching a semiconductor die by flowing a layer of etchant over an exposed, inactive surface of the semiconductor die. In one embodiment, the apparatus includes a first member having a support surface for supporting or holding a semiconductor die. The semiconductor die may be disposed within a semiconductor package with the semiconductor package being supported or held by the first member. The apparatus may also include a second member having a first surface disposed adjacent the support surface of the first member such that when a semiconductor die is disposed on the support surface an exposed surface of the semiconductor die is adjacent the first surface of the second member. A channel is formed between the first surface of the second member and the exposed surface of the semiconductor die. An input conduit in fluid communication with one side of the channel provides a supply of etchant to the channel for flowing across the exposed surface of the semiconductor die. In this configuration, etchant passes through the input conduit and across the exposed surface from one edge of the exposed surface to the other to etch the semiconductor die. The semiconductor package is double-sealed within the apparatus to limit leakage of fluid, such as acid, from the apparatus.

Pursuant to one embodiment, in operation, a semiconductor die having an exposed surface is initially provided. Next, a first acidic solution is flowed across the exposed surface to at least partially remove any oxide formed on the exposed surface. The first acidic solution may include hydrofluoric acid. Next, an etchant is flowed across the exposed surface from one edge to the other to etch the semiconductor die. In one embodiment, the etchant comprises a mixture of nitric acid, hydrofluoric acid, and glacial acidic acid. Lastly, a second acidic solution, which may comprise a mixture of hydrofluoric acid and nitric acid, is flowed across the exposed surface of the semiconductor die to at least partially polish the exposed surface of the semiconductor die.

These and other aspects, features, and capabilities of the present invention will be apparent from a reading of the following detailed description and the accompanying drawings.

BRIEF DESCRIPTION OF THE DRAWINGS

In the various drawings, similar features typically have the same reference numbers.

DETAILED DESCRIPTION

Figure 1:
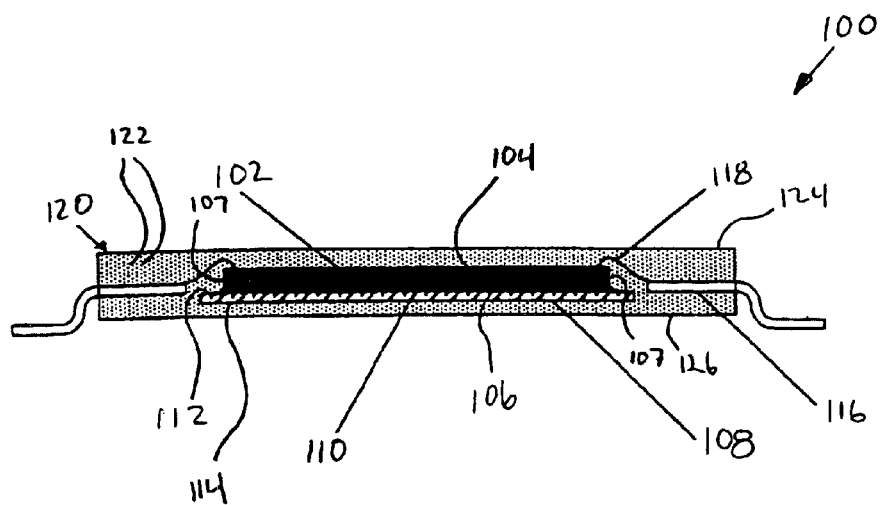
FIG. 1 is a cross-sectional side view of a conventional semiconductor package.

FIG. 1 illustrates a conventional semiconductor package 100 that includes a semiconductor die 102 having an active surface 104, an inactive surface 106, and side edges 107. In one embodiment, each of the surfaces 104 and 106 is generally rectangular and has an area of about 1 square centimeter. The semiconductor die 102 is mounted on a die pad 108, which includes opposing first and second surfaces 112 and 114. An adhesive 110 is disposed between the inactive surface 106 of the semiconductor die 102 and the first surface 112 of the die pad 108 to secure the semiconductor die 102 to the first surface 112 of the die pad 108 during the semiconductor packaging process.

The active surface 104 of the semiconductor die 102 is electrically coupled to leads 116 by conductive elements 118, which may comprise bond wires. The foregoing structures are then encapsulated by a body 120 of a plastic encapsulant 122. As shown, the leads 116 are partially encapsulated within the body 120 such that end portions thereof extend from the body 120. The body 120 may comprise a rectangular prism and has opposing first and second surfaces 124 and 126, that may be generally parallel to each other. Those skilled in the art will appreciate that the semiconductor package 100 of FIG. 1 is one example of a wide variety of semiconductor packages that may be used with the present apparatus and method.

Figure 2:
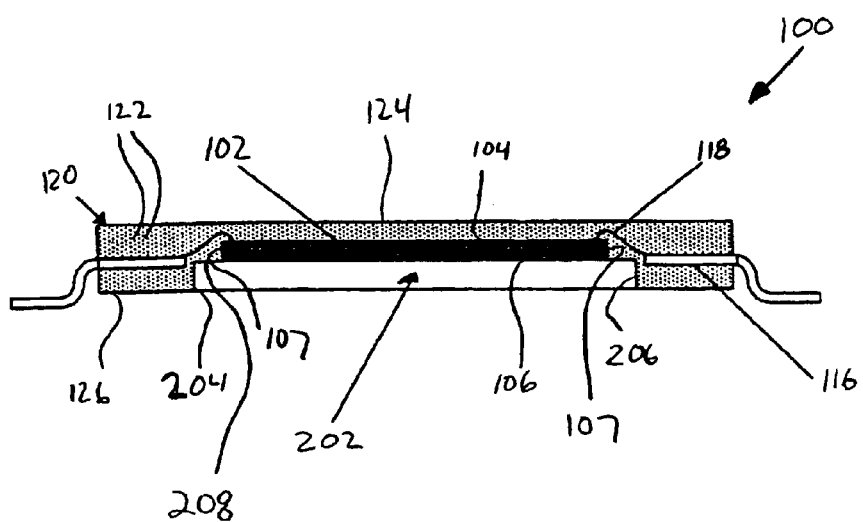
FIG. 2 is a cross-sectional side view of the FIG. 1 semiconductor package with a cavity formed therein.

FIG. 2 illustrates the semiconductor package 100 of FIG. 1 with a cavity 202 formed therein. As shown, the cavity 202 has an opening 204 at the second surface 126 of the body 120 and is generally defined by side walls 206, a cavity floor 208, and the inactive, or exposed, surface 106 of the semiconductor die 102. The side walls 206 may be generally orthogonal to and intersect the second surface 126 of the body 120 along the opening 204. The cavity floor 208 may also be orthogonal to the side walls 206 of the cavity 202. The inactive surface 106 is exposed to cavity 202 through the cavity floor 208. Although the shape of the cavity floor 208 may vary, in one embodiment, the cavity floor 208 is rectangular and is larger than the inactive surface 106 such that the cavity floor 208 is configured about a periphery of the inactive surface 106. The cavity 202 may be formed by conventional mechanical techniques, such as by conventional micro-milling techniques. In addition, the die 102 may be at least partially thinned by mechanical techniques.

Figure 3:
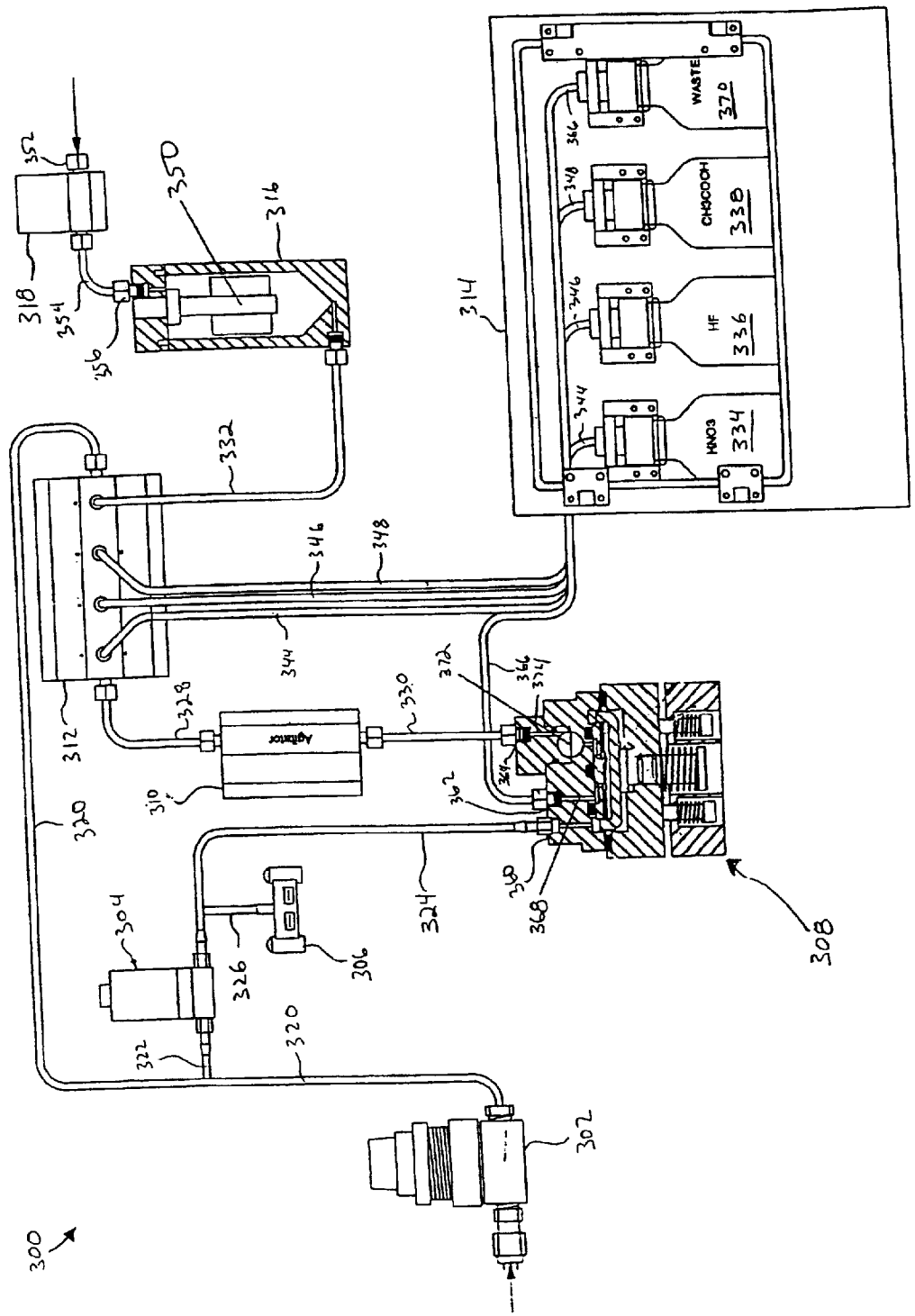
FIG. 3 is a schematic diagram of one embodiment of a semiconductor die etching system.

FIG. 3 schematically illustrates a semiconductor die etching system 300 according to one embodiment of the present invention. The semiconductor die etching system 300 includes a pressure regulator 302, a pressure valve 304, a pressure switch 306, an etching apparatus 308, an agitator 310, a pump 312, a storage unit 314, a water tank 316, and a water valve 318. Use of the agitator 310 is optional.

The pressure regulator 302 is coupled to a supply of pressurized gas, such as nitrogen or clean, dry air, and supplies the pressurized gas to the pressure valve 304 via fluid conduits 320 and 322 at a pressure of about 2 psi. The fluid conduits 320 and 322 may comprise elastomeric tubing, such as conventional rubber hoses, or the like, which are suitable for conducting fluids between different components. One end of the fluid conduit 320 is coupled to and in fluid communication with the pressure regulator 302 and the other end of the fluid conduit is coupled to the pump 312. One end of the fluid conduit 322 is coupled to an intermediate location of the fluid conduit 320, such as by a "T" connector or manifold, with the other end of the fluid conduit 322 coupled to and in fluid communication with the pressure valve 304. In this configuration, the pressure regulator 302 provides a substantially constant pressure of pressurized gas to the pressure valve 304 and to the pump 312.

A fluid conduit 324 interconnects and provides fluid communication between the pressure valve 304 and the etching apparatus 308 to provide the etching apparatus with a supply of pressurized gas. The pressure valve 304 permits fluid to pass through the pressure valve from the fluid conduit 322 to the fluid conduit 324. The pressure switch 306 is coupled to an intermediate location of the fluid conduit 324 by a fluid conduit 326, such as by a "T" connector. The pressure switch 306 turns on and off according to the pressure in the fluid conduit 324.

The pump 312 may comprise a pneumatically actuated positive displacement multi-port pump for providing fluids to the etching apparatus 308 via fluid conduit 328, the agitator 310, and the fluid conduit 330. Pursuant to one embodiment, the pump 312 may pump liquid at a rate of about 500 micro-liters/second at a pressure of about 17 psi. In one embodiment, the pump 312 may comprise the pump disclosed in U.S. patent application Ser. No. 09/540,485 entitled "Multiport Metering Pump" filed Mar. 31, 2000, by Kirk A. Martin, now U.S. Pat. No. 6,350,110, issued Feb. 26, 2002, which is hereby incorporated by reference in its entirety.

As illustrated, the pump 312 is in fluid communication with the water tank 316 via a fluid conduit 332, which is coupled at one end to the pump 312 and coupled at an opposing end to the water tank 316. In this configuration, the water tank 316 supplies the pump with water, such as deionized water, via the conduit 332 at substantially constant pressure.

The pump 312 is also coupled to containers 334, 336, and 338 by fluid conduits 344, 346, and 348, respectively, which provide the pump 312 with a supply of the contents of the respective containers 334, 336, and 338. In one embodiment, the container 334 contains a volume of an oxidizer, such as nitric acid, the container 336 contains a volume of hydrofluoric acid, and the container 338 contains a volume of a dilutant, such as glacial acetic acid. The containers may be stored in the storage unit 314. Other oxidizers, such as $H_2O_2$, $Cr_2O_2$, and $KMnO_4$, may be substituted for the nitric acid.

In general, the pump 312 pumps fluids from their respective containers to the fluid conduit 328. Additional details of the pump 312 are discussed below with reference to FIGS. 6 and 7.

The pump 312 delivers fluids to the agitator 310, which generally provides an oscillating or reciprocating fluid flow to the fluid conduit 330. In another embodiment, the agitator 310 is not used and the pump 312 delivers fluids directly to the etching apparatus 308.

The agitator 310 is shown as being disposed between the pump 312 and the etching apparatus 308 and is coupled to the pump via the fluid conduit 328 and is coupled to the etching apparatus 308 via the fluid conduit 330. In one embodiment, the agitator 310 contains two pneumatically actuated displacement diaphragms that may be set for a certain dispense volume, such as 300 microliters. A single solenoid valve operates the two diaphragms. Since, according to one embodiment, the pump 312 may only dispense fluid intermittently, fluid within the etching apparatus 308 may be static during some periods. If etchant is permitted to stop flowing for a significant amount of time, undesirable amounts of heat and gas may locally accumulate and may cause an unevenly etched surface.

The agitator 310 may operate continuously so that etchant is drawn into the agitator 310 from the pump 312 and then immediately dispensed to the etching apparatus 308. The agitator operates in a manner that is generally asynchronous with the output of the pump 312, thereby creating an oscillating or reciprocating flow of fluid across the surface to be etched, such as the inactive surface 106 of the semiconductor die 102. In this embodiment, the only time the flow across the inactive surface 106 of the semiconductor die 102 is static is at the instant when the flow direction changes. The agitator 310 may have a displacement sufficiently large to produce fluid velocities above 0.7 meters/second across the exposed surface 106 (FIG. 2) of the semiconductor die 102, where the exposed surface 106 has an area of one square centimeter. The agitator 310 may create a flow in one direction that lasts for about 400 milli-seconds and then reverses for another 400 milli-seconds. In one embodiment, this produces an equivalent flow rate of about 90 ml per minute.

In addition, a heat exchanger (not shown) or a cooler (not shown) may optionally be employed to vary or control the temperature of the fluid being provided from the pump 312 to the etching apparatus 308. Pursuant to one embodiment, the heat exchanger or cooler may be disposed along the fluid path between the pump 312 and the etching apparatus 308 in series with, or in place of, the agitator 310.

The water tank 316 is coupled to the pump 312 via a fluid conduit 332 to supply the pump 312 with water, such as deionized water, at an acceptable, and substantially constant, pressure. The water tank 316 includes a water level detector 350, such as a float switch, and is coupled to the water valve 318 by a fluid conduit 354. Deionized water may be supplied to an inlet 352 of the water valve 318 at pressures in the range of about 5–60 psi, which may exceed a maximum inlet pressure of the pump 312. In addition, such a range may alter operation of the pump 312. Further, interruption of the water supply during an etch process could limit the ability of the etching apparatus 308 to property remove etchant material disposed therein.

The water valve 318 supplies water to the water tank 316 via the fluid conduit 354 until the water level detector 350 detects that the water level has reached a predetermined level within the water tank 316, at which point the water level detector 350 terminates the water flow from the water valve 318 through a water tank inlet 356. In this manner, the water valve 318 and water tank 316 provide the pump 312 with an adequate supply of water at a substantially constant pressure.

The etching apparatus 308 includes a pressurized gas inlet 360, a waste outlet 362, and a fluid inlet 364. The pressurized gas inlet 360 provides pressurized gas, such as air at about 2 psi, to the etching apparatus 308 from the fluid conduit 324. The waste outlet 362 is coupled to a fluid conduit 366 for outputting waste fluids from the etching apparatus waste conduit 368 through the waste outlet 362 and the fluid conduit 366 to a waste container 370. The fluid inlet 364 provides fluid to a spherical mixing chamber 372 via conduit 374.

In general, the semiconductor package 100 of FIG. 2 is disposed within the etching apparatus 308 for thinning the die 102 by flowing a layer of etchant within the cavity 202 and across the exposed surface 106 of the die 102. The pump 312 supplies an etchant, which may comprise a mixture of the contents of the containers 334, 336, and 338, to the inlet 364, such as via the agitator 310 and the fluid conduits 328 and 330. The etchant is then mixed in the spherical mixing chamber 372, flows over the inactive surface 106 of the die 102 (FIG. 2), and exits the etching apparatus 308 via the conduit 368 and the waste outlet 360. Additional details regarding the etching apparatus 308 and the etching process are discussed below.

Figure 4:
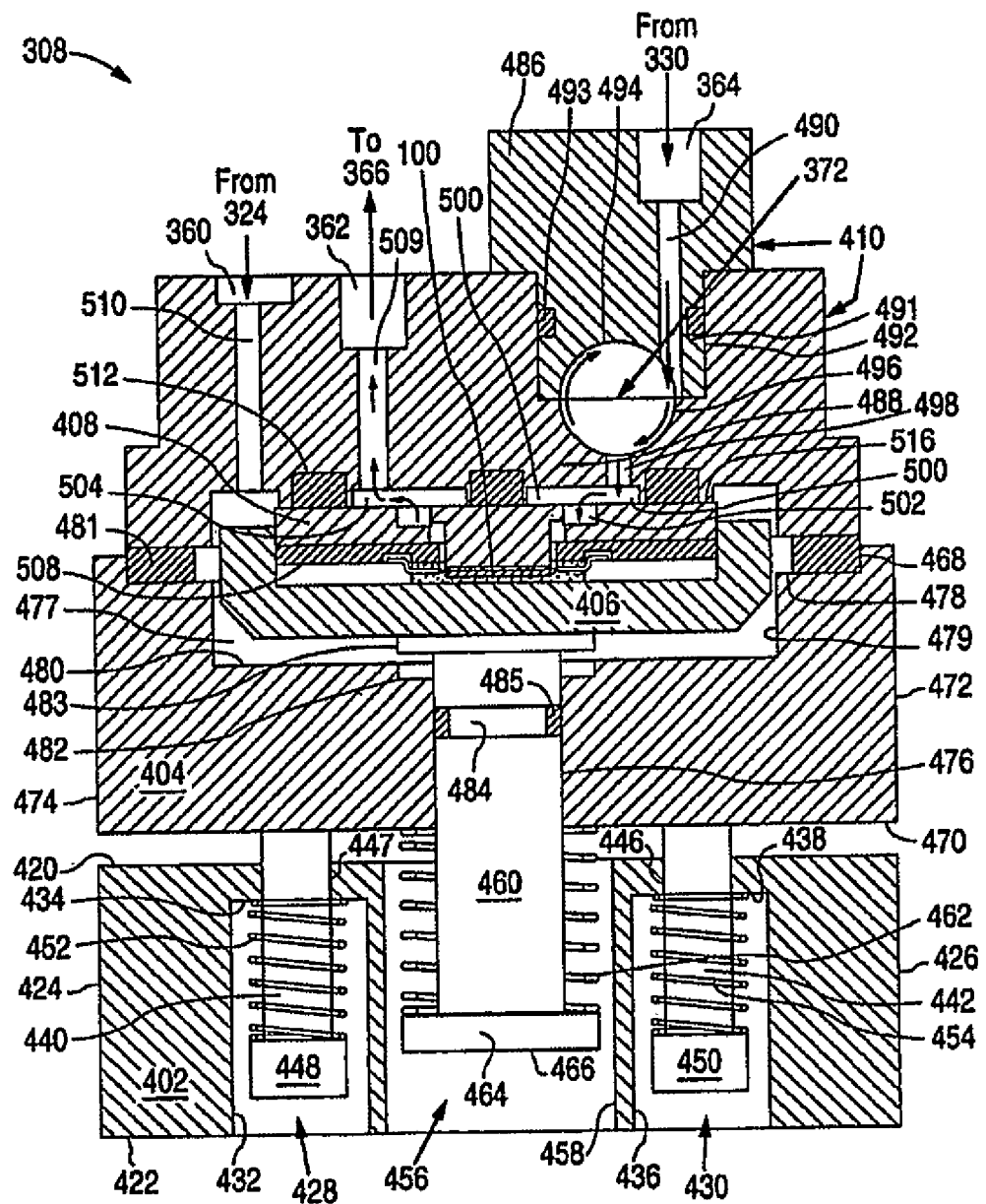
FIG. 4 is a cross-sectional side view of a FIG. 3 etching apparatus.
Figure 5:
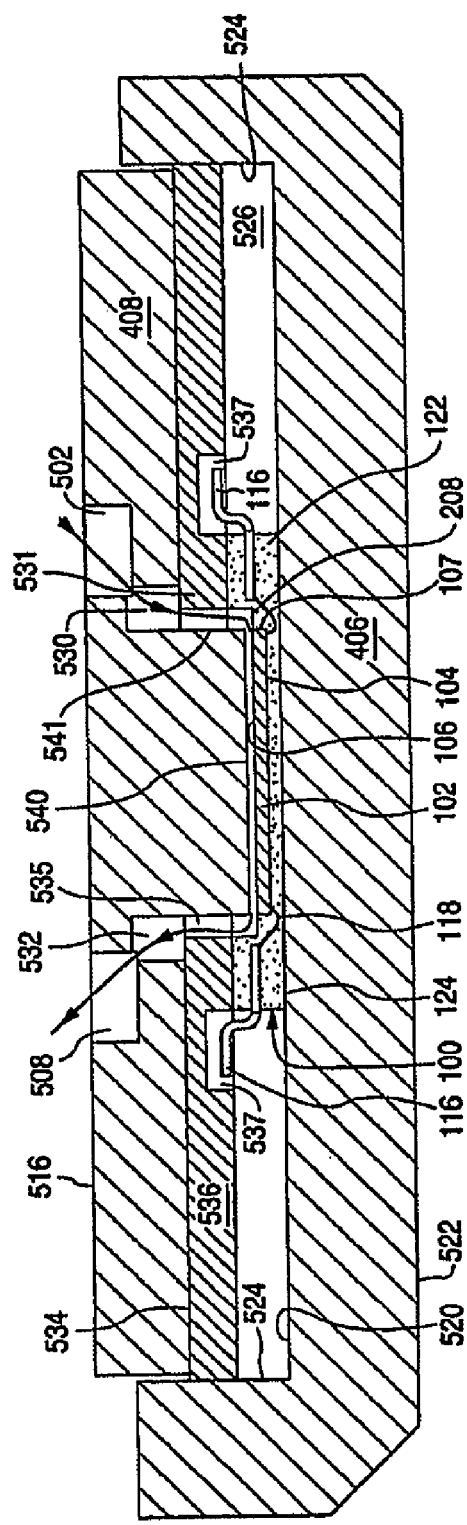
Figure 6:
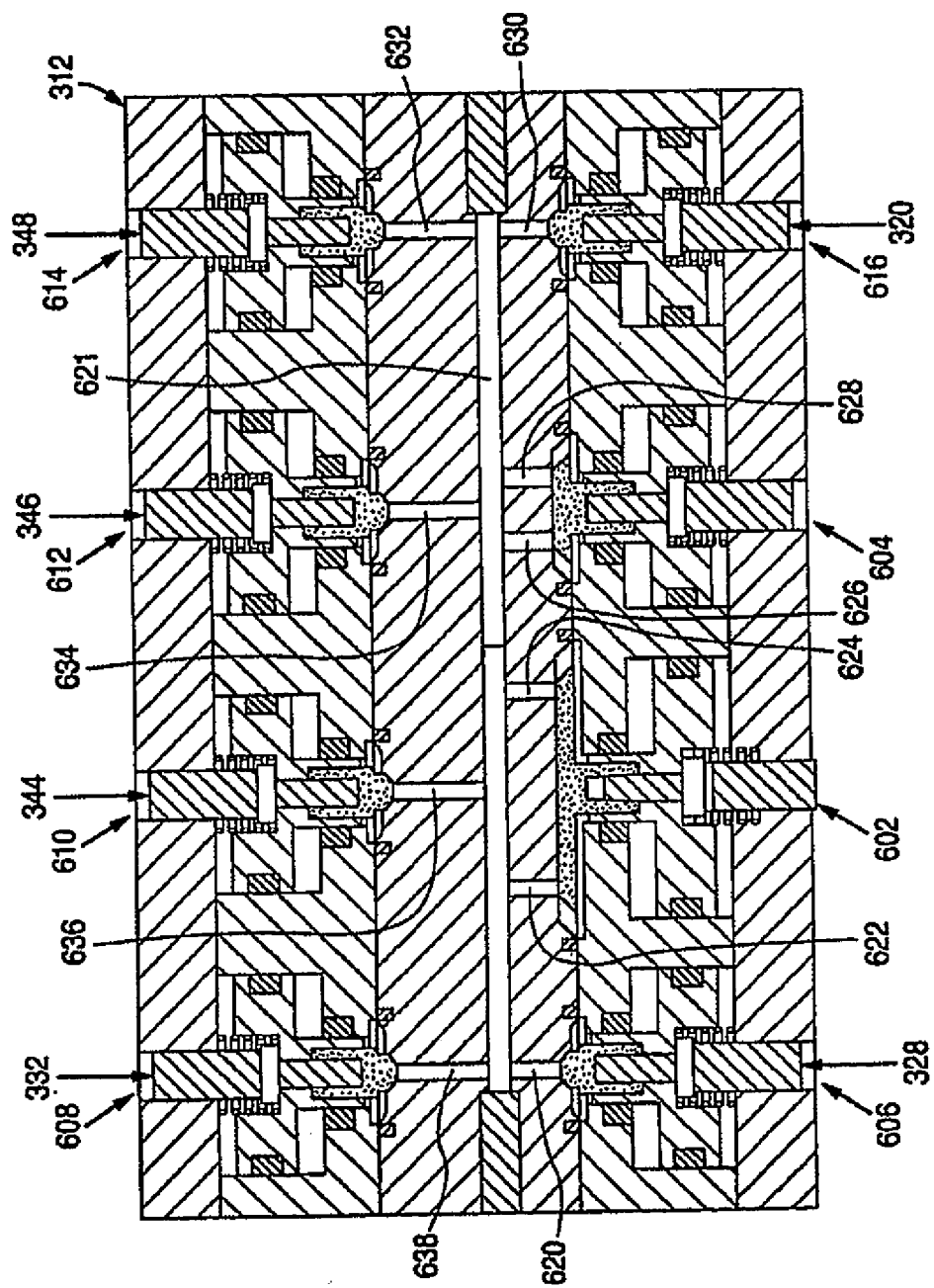
Figure 7:
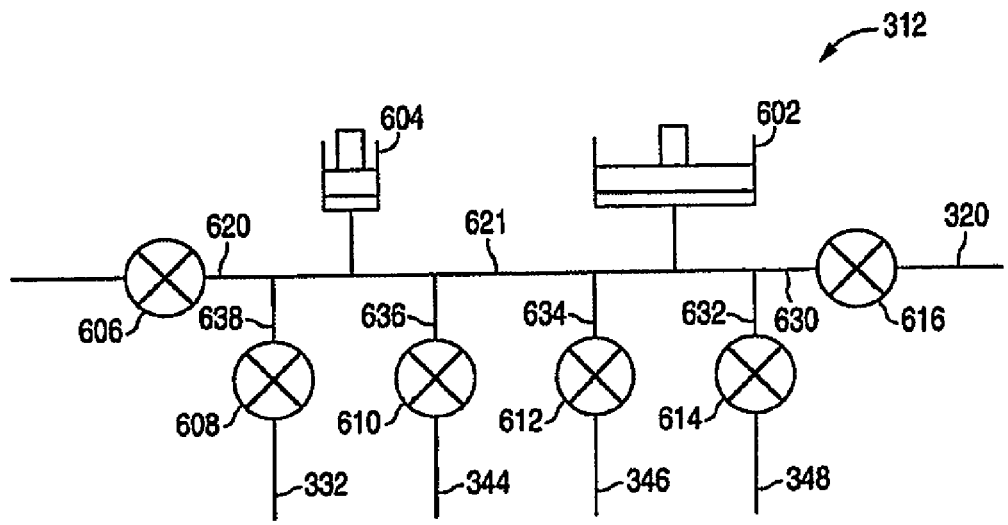

FIG. 4 is a side cross-sectional view of the etching apparatus 308 of FIG. 3. The etching apparatus 308 includes a carriage 402, a base 404, a holder 406, an adapter 408, and a head 410. These components may be formed of Polytetrafluoroethylene (PTFE), or other material substantially inert to acids, such as nitric acid, hydrofluoric acid, glacial acetic acid, and mixtures thereof.

The carriage 402 is illustrated as comprising a rectangular prism having opposing first and second surfaces 420 and 422 and opposing side surfaces 424 and 426. A pair of cavities 428 and 430 are formed in the carriage 402. The cavity 428 may be cylindrical and is defined by side walls 432 and a floor 434 and the cavity 430 may also be cylindrical and is defined by side walls 436 and a floor 438. The carriage floors 434 and 438 have apertures 444 and 446 respectively formed therein that extend through the carriage 402 to the first surface 420 of the carriage 402.

Carriage rods 440 and 442 are at least partially disposed within the apertures 444 and 446 respectively and have shoulders 448 and 450 respectively formed on proximal ends thereof. Carriage springs 452 and 454 are respectively disposed about the carriage rods 440 and 442 and are positioned within the cavities 428 and 430, respectively between the carriage shoulders 440 and 450 and cavity floors 434 and 438. The purpose and function of the carriage rods 440 and 442 and the corresponding carriage springs 452 and 454 are discussed below.

The carriage 402 also has a cylindrical aperture 456 formed therein, which extends through the carriage 402 between the first and second surfaces 420 and 422 of the carriage 402. The aperture 456 is of sufficient size to accommodate a post 460 and spring 462. The spring 462 is illustrated as being disposed about the post 460 and as resting on a post shoulder 464. As discussed in more detail below, in operation, a pneumatic cylinder (not shown), pushes against a bottom surface 466 of the post 460 to move the base 404 and the holder 406 relative to the head 410.

The base 404 is shown as having opposing top and bottom surfaces 468 and 470 and opposing side surfaces 472 and 474 and has a through hole 476 therethrough. As shown, the through hole 476 is of sufficient size to accommodate the post 460 therein. The base 404 includes a cavity 477 defined by a shoulder 478, lateral edge 479, and a floor 480. The shoulder 478 has a sealing member 481, such as an elastomeric gasket, disposed thereon for sealing the cavity 477 between the base 404 and the head 410. The floor 480 may include a recessed portion 482 sized to accommodate a shoulder 483 formed on the post 460 adjacent the holder 406.

The post 460 is also shown as including a groove 484 formed therein between the shoulders 464 and the 483 and is oriented substantially orthogonal to a longitudinal axis of the post 460 and is sized to accommodate a sealing member 485, such as an O-ringtype gasket. The sealing member 485 may be slightly compressed between the post 460 and the base 404 to provide an effective seal between the post 460 and the base 404 for substantially preventing fluid flow to or from the cavity 477 through the hole 476.

The head 410 may comprise first and second components 486 and 488, that are coupled together, such as in a mating fashion to form the head 410. As illustrated, the first component 486 includes the inlet 364 and a conduit 490 disposed between the inlet 364 and the spherical mixing chamber 372. The first component 486 of the head 410 is shown as having a distal portion 491 disposed within a cavity 492 formed in the second component 488. A sealing member 493, such as an O-ring type gasket, seals the distal portion 491 of the first component 486 within the cavity 492.

As shown, a top portion 494 of the spherical mixing chamber 372 is formed in the first component 486 of the head 410. The top portion 494 of the spherical mixing chamber 372 is also oriented relative to the conduit 490 such that fluid entering the spherical mixing chamber 372 from the conduit 490 enters the spherical mixing chamber tangentially. Providing fluid into the spherical mixing chamber 372 in a tangential fashion, creates turbulent shear mixing of the entering fluid with fluid already disposed within the spherical mixing chamber 372. In one embodiment, the spherical mixing chamber 372 has a volume of about 0.5 ml.

The bottom portion 496 of the spherical mixing chamber 372 is formed in the second component 488 of the head 410 adjacent the cavity 492 and is aligned with the top portion 494 to define the spherical mixing chamber 372. The bottom portion 496 of the spherical mixing chamber 372 includes a conduit 498 in fluid communication with and oriented radially to the spherical mixing chamber 372.

A cavity 500 is formed in the second component 488 of the head 410 adjacent to and in fluid communication with the conduit 498 and permits fluid flow from the output conduit 498 through the cavity 500 and into an inlet cavity 502 formed in the adapter 408.

A cavity 504 is also formed in the second component 488 of the head 410 adjacent to and in fluid communication with an output conduit 506 formed in the head 410. The cavity 504 permits fluid flow from a cavity 508 formed in the adapter 408 and the output conduit 506. The output conduit 506, in turn, permits fluid passage from the cavity 504 to the outlet 362 for discharge through the fluid conduit 366.

A pressurized gas conduit 510 is formed in the second component 488 of the head 410 between the pressurized gas inlet 360 and the cavity 477 to provide pressurized gas from the fluid conduit 324 to the cavity 477. In one embodiment, the pressurized gas has a pressure of about 2 psi.

A sealing member 512, which may comprise an elastomeric gasket, is disposed between the head 412 and the adapter 408, which creates a seal between the second component 488 of the head 412 and a top surface 516 of the adapter 408. Among other things, the sealing member 512 substantially prevents fluid passage between the cavities 500, 504, and 477. According to one embodiment, the base 404, the post 460, and the holder 406 are initially positioned in a lowered position (not shown). In the lowered position, the bottom surface 470 of the base 404 may be in contact with the top surface 420 of the carriage 402 and the holder 406 may be in contact with the floor 480 of the base 404. Moreover, in the lowered position, the post 460 is lowered such that the shoulder 483 rests within the recessed portion 482 of the base 404 with the springs 452, 454, and 462 being substantially decompressed. In the lowered position, the semiconductor package 100 of FIG. 2 may be disposed on the holder 406 as illustrated.

The post 460 is then advanced toward the head 410, such as by a pneumatic cylinder. In one embodiment, the spring 462 is significantly stronger than the springs 452 and 454 so that the base 404, holder 406, and post 460 are initially raised in concert, until the sealing member 481 contacts the second component 488 of the head 412. When the sealing member 481 makes contact with the second component 488 of the head 412, the base 404 stops travel and the post 460 continues to advance the holder 406 toward the head 410 until the adapter 408 contacts the head 410.

The pressure generated by the spring 462 compresses the sealing member 481 sealing the base 404 and the second component 488 of the head 410. The cavity 477 may then be pressurized by pressurized gas delivered through the fluid conduit 324, inlet 360, and conduit 510. Fluid from the pump 312 (FIG. 3) may the be delivered via the fluid conduit 330, inlet 364, and conduit 490 into the spherical mixing chamber 372 so that the fluid enters the spherical mixing chamber 372 in a substantially tangential fashion.

After the fluid mixes in the spherical mixing chamber 372, the fluid exits the spherical mixing chamber through conduit 498 and passes through the cavity 500 to the cavity 502 formed in the adapter 408. The fluid then flows across an exposed surface 106 of the semiconductor die 102 (FIG. 2). Details regarding the adapter 408, the holder 406, and fluid flow across the exposed surface 106 of the semiconductor die 102 are discussed in more detail below with reference to FIG. 5.

After flowing across the exposed surface 106 of the semiconductor die 102, the fluid exits the adapter 408 through the cavity 508, passes through the cavity 504, and exits the head 410 through the conduit 506, the outlet 362 and the fluid conduit 366. The discharged fluid may pass through the fluid conduit 366 and be deposited in the container 370 (FIG. 3) for later disposal.

Figure 5:
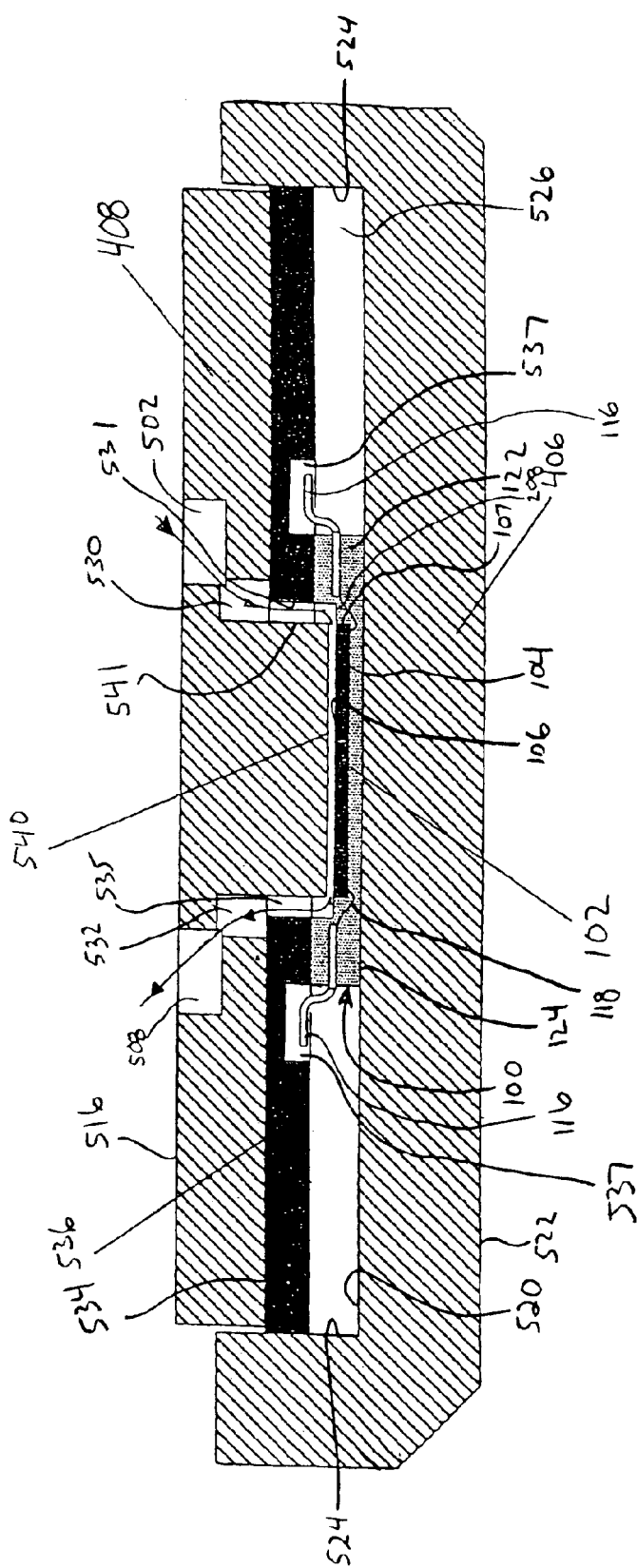
FIG. 5 is a cross-sectional side view of a holder and head in the etching apparatus of FIG. 4.

FIG. 5 illustrates details of the holder 406 and the adapter 408 shown in FIG. 4. As shown, the holder 406 includes opposing first and second surfaces 520 and 522 as well as side walls 524 on opposite sides of the first surface 520. The side walls 524 and the first surface 520 define a cavity 526, into which the semiconductor package 100 is disposed. The first surface 124 of the body 120 (FIG. 2) is disposed adjacent to, and in contact with, the first surface 520 of the holder 406 and the exposed surface 106 of the semiconductor die 102 faces in the same direction as the first surface 520 of the holder 406. In one embodiment, a resilient member (not shown), such as a foam pad, is positioned between the first surface 124 and the holder 406 to help secure the semiconductor package 100 on the holder 406.

The adapter 408 includes the cavities 502 and 508 as discussed above with reference to FIG. 4. The adapter 408 also includes a cavity 530 disposed between the cavity 502 and the cavity 526 to permit fluid to flow from the cavity 502 into the cavity 526. Likewise, the adapter 408 includes a cavity 532 disposed between the cavity 508 and the cavity 526 to permit fluid flow from the cavity 526 to the cavity 508.

The adapter 408 also includes a sealing member 536 adjacent a bottom surface 534 of the adapter 408. In one embodiment, the sealing member 536 comprises an elastomeric gasket and may be coupled to the bottom surface 534 of the adapter 408, such as by adhesion, an interference fit, or the like. The sealing member 536 is disposed between the adapter bottom surface 534 and the surface 126 of the semiconductor package 102. The sealing member 536 may also include grooves 537 sized to accommodate the leads 116 of the semiconductor package 100, as shown. The sealing member 536 also includes a through hole 535 defined by side walls 531 to permit disposition of an adapter boss 541 through the hole 535.

The adapter 408 also includes a flow surface 540 disposed on an end of adapter boss 541. The flow surface generally faces, and is substantially parallel to, the exposed surface 106 of the semiconductor die 102. In one embodiment, a channel, or gap, having a vertical dimension of about 0.2 mm is formed between the flow surface 540 and the exposed surface 106 of the semiconductor die 102. The vertical dimension of the gap may vary, such as by using a differently sized adapter boss 541 or package 100. The flow surface 540 may also be of substantially the same shape and area as the exposed surface 106 of the semiconductor die 102. In the embodiment illustrated in FIG. 5, the flow surface 540 of the adapter boss 541 is disposed within the cavity 202 formed in the semiconductor package 100. That is, the flow surface 540 is disposed between a plane including the surface 126 of the body 120 and a plane including the exposed surface 106 of the semiconductor die 102.

In this configuration, fluid, such as an etchant, enters the adapter cavity 502, passes through the adapter cavity 530, through the hole 535 and into the cavity 202 formed in the semiconductor package 100. As shown in the embodiment of FIG. 5, the fluid enters the cavity 202 at an angle substantially orthogonal to the exposed surface 106 and the surface 208 of the semiconductor die 102. The fluid then flows from one edge 107 across substantially the entire exposed surface 106 of the semiconductor die 102 through the channel formed between the exposed surface 106 and the flow surface 540 to the other edge 107. In one embodiment, the fluid flows across the exposed surface 106 of the die 102 at a rate greater than about 0.7 meters/second. The fluid may also pass over at least a portion of the cavity floor 208 adjacent the edges 107.

After passing across the exposed surface 106 of the semiconductor die 102, the fluid flows through the hole 535, the cavity 532, and the cavity 508 to the cavity 504 (FIG. 4). The fluid then passes through the conduit 506 (FIG. 4) to the fluid conduit 366 (FIG. 3) to the container 370 (FIG. 3).

Figure 6:
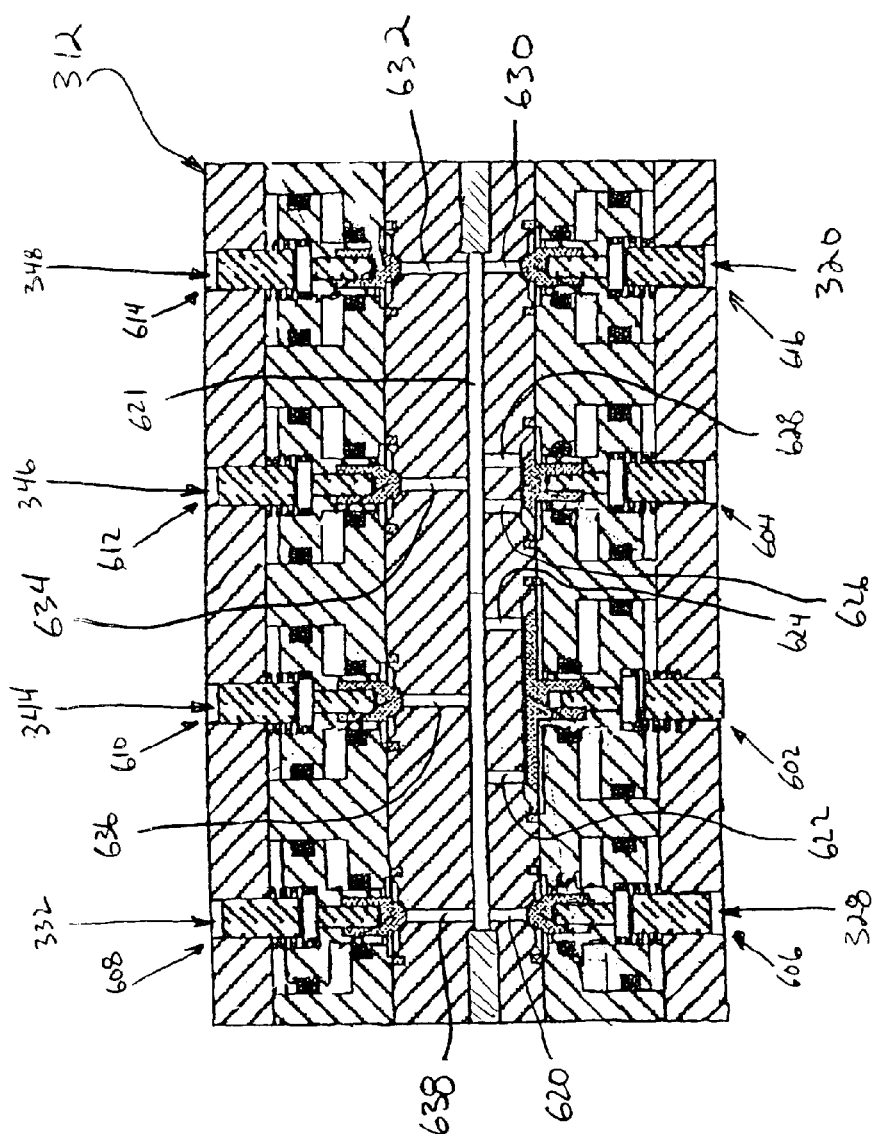
FIG. 6 is a cross-sectional side view of a pump in the etching system of FIG. 3.
Figure 7:
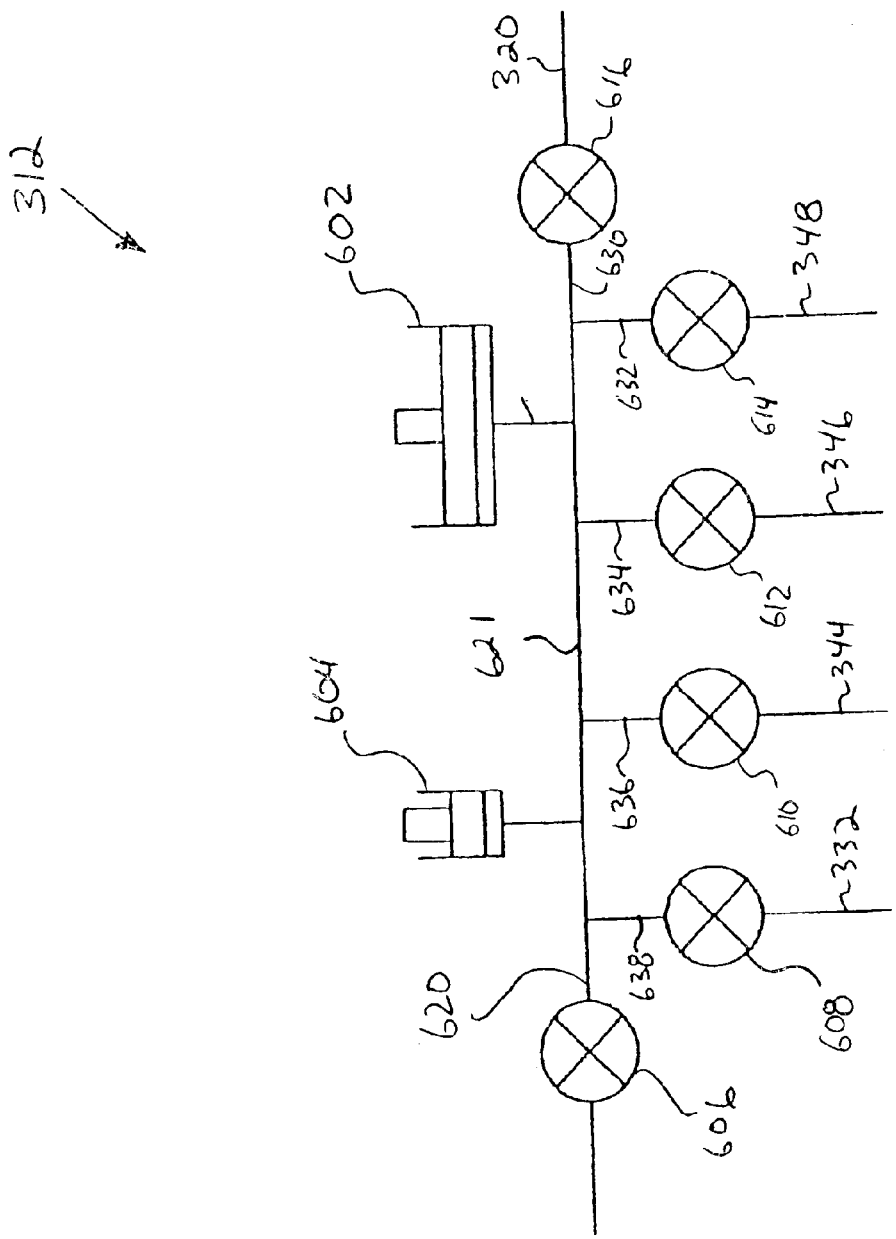
FIG. 7 is a schematic diagram of the pump in the etching system of FIG. 3.

FIGS. 6 and 7 illustrate details of the pump 312, which may comprise a multiport metering pump. As shown, the pump 312 includes a first displacement unit 602, a second displacement unit 604; six valve units 606, 608, 610, 612, 614, and 616; a central gallery 621, and ten conduits 620, 622, 624, 626, 628, 630, 632, 634, 636, and 638. Conduits 622 and 624 connect the first displacement unit 602 with the central gallery 621 and conduits 626 and 628 connect the second displacement unit with the central gallery 621. Conduits 620, 630, 632, 634, 636, and 638 respectively connect valve units 606, 616, 614, 612, 610, and 608 with the central gallery 621.

The valve units 606, 608, 610, 612, 614, and 616 may be configured identical to each other. In one embodiment, the valve units 606, 608, 610, 612, 614, and 616 may be identical to the valve units disclosed in U.S. patent application Ser. No. 09/540,485 entitled "Multiport Metering Pump" filed Mar. 31, 2000, by Kirk A. Martin, now U.S. Pat. No. 6,350,110, issued Feb. 26, 2002, which is incorporated by reference in its entirety.

The valve unit 606 is coupled to the fluid conduit 328 for outputting fluid from the pump 312. The valve unit 608 is coupled to the fluid conduit 332 (FIG. 3) for delivering water from the water tank 316 to the pump 312. The valve unit 610 is coupled to the fluid conduit 344 (FIG. 3) for providing nitric acid from the container 334 to the pump 312. The valve unit 612 is coupled to the fluid conduit 346 (FIG. 3) for providing hydrofluoric acid from the container 336 to the pump 312. The valve unit 614 is coupled to the fluid conduit 348 (FIG. 3) for providing glacial acetic acid from the container 338 to the pump 312. The valve unit 616 is coupled to the fluid conduit 320 (FIG. 3) for providing pressurized air to the pump 312.

Moreover, the first and second displacement units 602 and 604 may comprise displacement units of different sizes. In one embodiment, the first displacement unit 602 comprises a 250 micro-liter displacement unit and the second displacement unit 604 comprises a 50 micro-liter displacement unit. The first and second displacement units 602 and 604 may be identical to the displacement unit disclosed in U.S. patent application Ser. No. 09/540,485 entitled "Multiport Metering Pump" filed Mar. 31, 2000 by Kirk A. Martin, which is incorporated by reference in its entirety.

In general, the pump 312 can deliver fluid from one to another of the valve units 606, 608, 610, 612, 614, and 616. When at rest, that is, before delivering a fluid, each of the valve units 606–616 is closed, and the first and second displacement units 602 and 604 are in minimum volume position. According to this configuration, the pump 312 moves the acids in containers 334, 336, and 338 (FIG. 3) and the water in the tank 316 are respectively moved from their respective locations to the etching apparatus 308.

For example, to pump water from the valve unit 608 out of the pump 312 through the valve unit 606, the process may be as follows. Initially, all valve units 606–616 are closed with the displacement units 602 and 604 in a minimum volume position. Next, the valve unit 608 opens, allowing the conduit 332 to communicate with the central gallery 621. One or both of the displacement units 602 and 604 is then moved to a maximum volume position drawing fluid from the conduit 332 into the central gallery 621 through the valve unit 608. Next, the valve unit 608 is closed to isolate the conduit 332 from the central gallery 621. Valve 606 is then opened to allow the conduit 328 to communicate with the central gallery 621. One or both of the displacements units 602 and 604 may then be moved to a minimum volume position to dispense the fluid drawn through the valve unit 608 through the valve unit 606 and out of the pump 312 through the fluid conduit 328.

The pump 312 in one embodiment, is capable of dispensing 50, 200, 250, and 300 micro-liters of fluid by correctly operating the first and second displacement units 602 and 604. Moreover, the pump 312 may be attached to a manifold plate (not shown) that provides passages for pneumatic activation of each valve unit and displacement unit. The manifold plate may also support solenoid valve actuators (not shown) that control the pneumatic operation of the pump 312. A separate microprocessor (not shown) may be employed to operate the solenoid valves (not shown), control pump timing, and provide a function level interface to a system controller (not shown).

Figure 8:
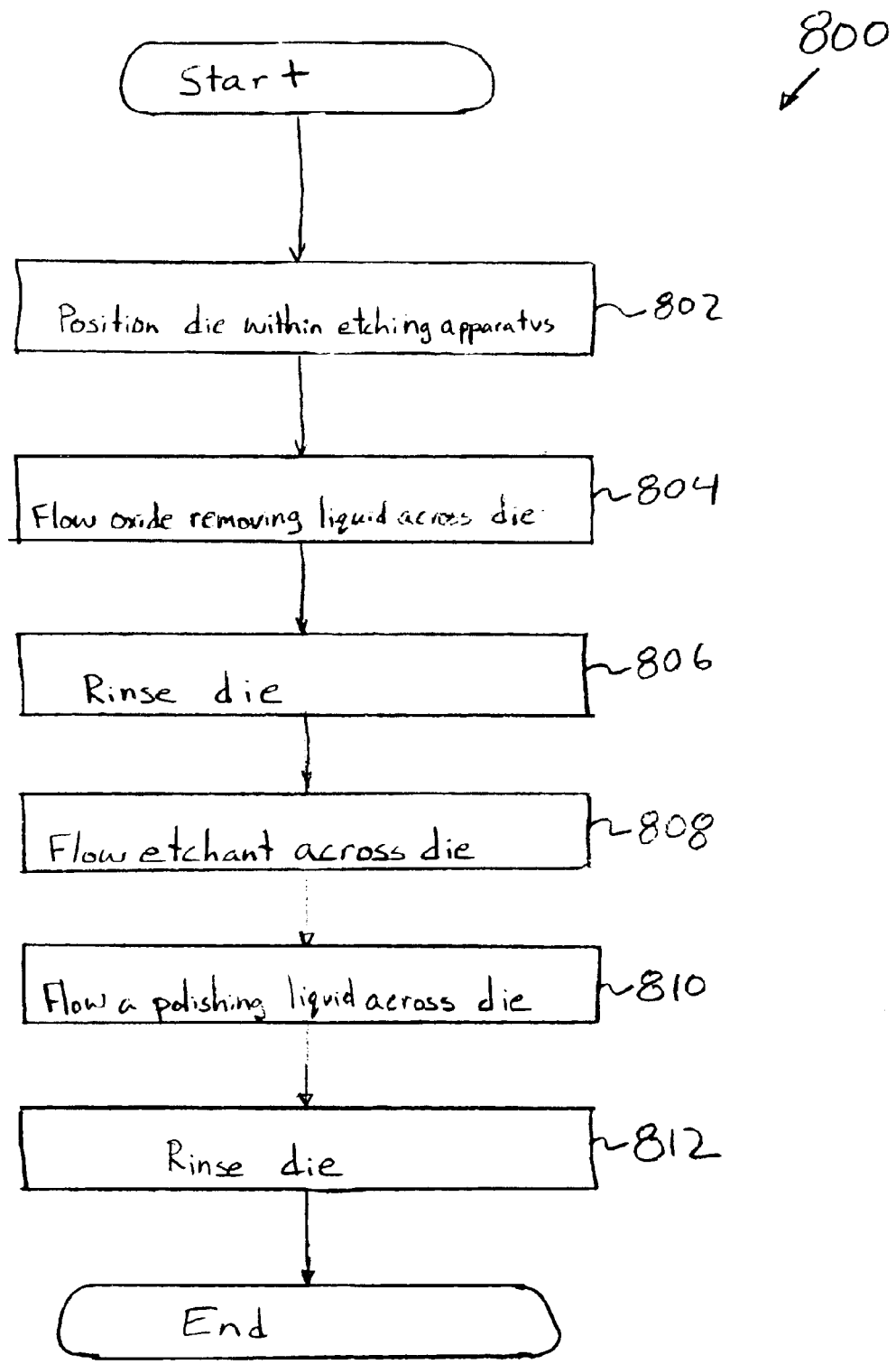
FIG. 8 is a flowchart illustrating one embodiment of a method of thinning a semiconductor die.
Figure 1:
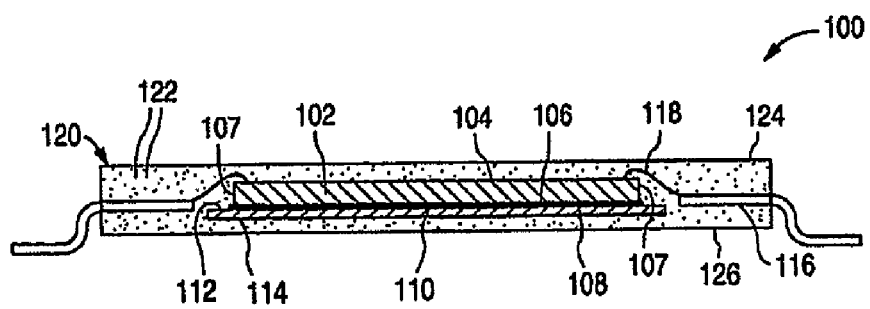
Figure 2:
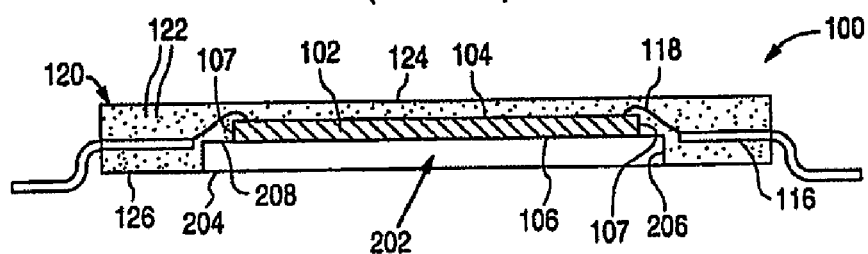
Figure 3:
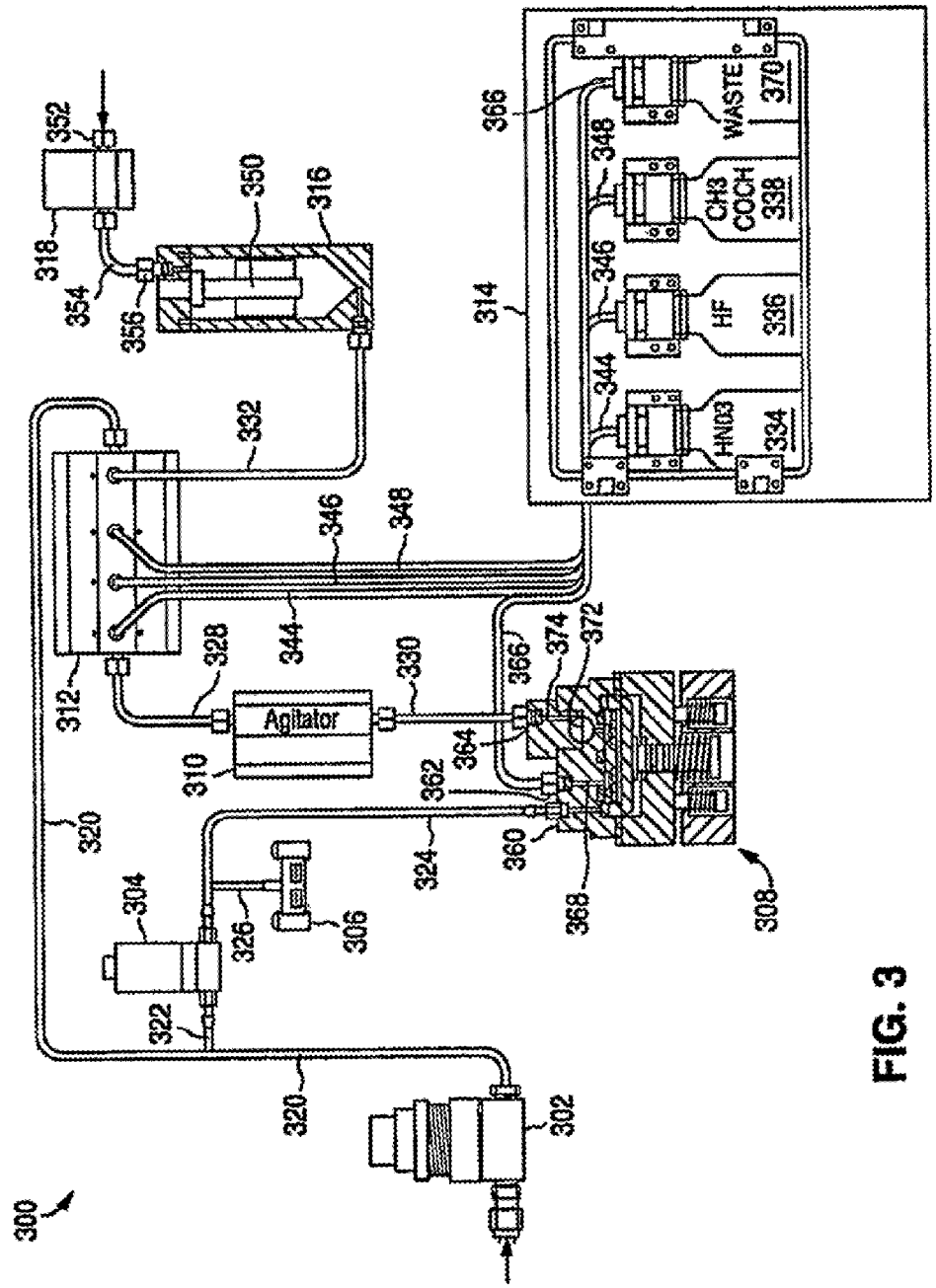

FIG. 8 is a flowchart 800 illustrating a method according to one embodiment of the present invention. Pursuant to block 802, the semiconductor package 100 (FIG. 2) is positioned within the etching apparatus 308 (FIG. 3). In particular, the semiconductor package 100 may be positioned on the first surface 520 of the holder 406, as shown in FIG. 5, with the cavity 202 facing in the same direction as the first surface 520 of the holder 406. The adapter 408 is then positioned adjacent the semiconductor package 100 with the adapter boss 541 extending at least partially into the cavity 202 formed in the semiconductor package 100. In this configuration, the flow surface 540 and the exposed surface 106 form a channel for flowing fluid, such as etchant, across the exposed surface 106 of the semiconductor die 102.

The post 460 then raises the base 404 to seal the base with the head 410 as shown in FIG. 4. The post 460 then continues to rise until the adapter 408 is sealed to the etch head 410 as shown in FIG. 4. The cavity 477 (FIG. 4) may then be pressurized to about 2 psi by delivering pressurized gas through the conduit 510 formed in the head 410. In one embodiment, a travel sensor (not shown) mounted on the post 460 determines that the post 460 is at a position consistent with proper fixturing of the various components of the etching apparatus 308.

Once the semiconductor package 100 is properly positioned within the etching apparatus 308, the etching apparatus 308 flows an oxide removing liquid across the exposed surface 106 of the die 102 from one edge 107 to the opposing edge 107 pursuant to block 804. In one embodiment, the oxide removing liquid may comprise an acidic mixture for removing at least a portion of any oxide on the exposed surface 106 of the die 102 to produce a clean silicon surface.

The oxide removing liquid may be formed of a mixture of five parts water to one part hydrofluoric acid. Specifically, this mixture may be generated in the pump 312 by drawing 50 micro-liters of hydrofluoric acid and 250 micro-liters of water into the pump 312 and dispensing the entire 300 micro-liters. The mixture then enters the head 410, passes through the spherical mixing chamber 372, and flows across the exposed surface 106 of the semiconductor die 102 from one edge to the other.

Optionally, after the flowing the oxide removing liquid across the exposed surface 106 of the semiconductor die, the valve 616 (FIG. 6) of the pump 312 opens to permit pressurized gas to at least partially blow out the liquid contents of the fluid conduits 328 and 330 and the etching apparatus 308.

Next, pursuant to block 806, the exposed surface 106 of the semiconductor die 102 is rinsed, such as with water. In some applications, it may be desirable to rinse the exposed surface 106 with about 1 ml of water to prevent inadvertent creation of a mixture that might etch the exposed surface 106. Optionally, after rinsing the exposed surface 106 of the semiconductor die 102, the pump 312 may deliver an amount of pressurized gas through the etching apparatus 308 to at least partially blow out of the etching apparatus any liquid disposed therein.

Pursuant to block 808, the etching apparatus 308 flows etchant across the exposed surface 106 of the semiconductor die 102 from one edge of the exposed surface 106 to the other to thin the semiconductor die 102. In one embodiment, before flowing the etchant from the pump 312, the pump 312 first delivers a quantity of nitric acid sufficient to fill the fluid conduits 328 and 330, as well as the spherical mixing chamber 372 with nitric acid. This initial pumping of nitric acid may prevent inadvertent creation of etching mixtures within the etching apparatus 308. After the fluid conduits 328 and 330 and the spherical mixing chamber 372 are filled with nitric acid, the pump 312 begins dispensing the etchant mixture, thus the volume contained in the spherical mixing chamber 372 gradually changes from nitric acid to the etchant mixture. In one embodiment, the volume in the spherical mixing chamber 372 is substantially changed to the etchant mixture after pumping about 1 ml of etchant into the spherical mixing chamber 372.

The etchant may comprise an acidic mixture having five parts 63% nitric acid, two parts 49% hydrofluoric acid, and three parts glacial acetic acid. It has been found that, in some applications, mixtures such as this may produce a satisfactory balance of etch rate, surface quality, and non-selectivity. Etch mixtures with lower amounts of hydrofluoric acid may etch slower and may selectively etch crystal defects producing a mat, decorated surface. Mixtures with higher amounts of hydrofluoric acid may etch faster and create a more polished surface, but may be more difficult to control and may produce sufficient heat to cause decomposition of the acids.

The flow of etchant across the exposed surface 106 of the semiconductor die 102 may be substantially uniform, turbulent, and high velocity. Since the etching, or thinning, process generates both heat and gases, the high velocity and the turbulence may break gas bubbles off of the exposed surface 106 of the semiconductor die 102 and create a near isothermal environment by removing, or dispersing, the generated heat. The uniformity of the flow across the exposed surface 106 of the semiconductor die 102 helps to produce an evenly etched surface 106. Moreover, the high velocity and the turbulence help refresh the etchant to maintain substantially uniform etch rates. The turbulence also helps increase etch rates as etch rates may be substantially diffusion-limited in a laminar flow regime. The etch reaction may be as follows:

$$3Si+18HF+4HNO_3 \rightarrow 3H_2SiF_6+8H_2O+4NO \quad (g).$$

In one embodiment, the chemical thinning generally occurs via a two-step reaction. Pursuant to the first step, the nitric acid oxidizes the exposed surface 106 of the semiconductor die 102 to form an oxide comprising $SiO_2$. In the second step of the reaction, the hydrofluoric acid removes the oxide by changing the oxide to a soluble anion, thus dissolving the oxide. The hydrofluoric acid thus serves as a complexing agent. In other embodiments, different oxidizing and complexing agents may be employed.

For a 1 cm square exposed surface 106 of the semiconductor die 102 that needs to be thinned by removing about 0.02 cm of material, removal of about 0.48 gm of silicon or about 1.71 m mol may be needed. This may require about 0.205 gm of hydrofluoric acid and 0.144 gm of nitric acid, and produces about 50 cubic centimeters of NO gas. In one embodiment, at least 10 times the consumed reactants are used to help keep the reaction even and not reactant-limited. Thus, about 4.1 ml of 49% hydrofluoric acid and 1 ml of 63% nitric acid may be used to etch, or thin, a 1 cm square exposed surface by about 0.02 cm. Optionally, an excess of oxidizer, such as nitric acid, and dilutant, such as glacial acetic acid or water, are used in the etchant mixture to help keep the reaction from being violent.

The flow of etchant across the exposed surface 106 of the semiconductor die 102 is substantially even and uniform across the surface normal to the plane shown in cross-section in FIG. 5. Moreover, as shown in FIG. 5, the flow of etchant changes from vertical to horizontal at the surface 208 and substantially off of the exposed surface 106 of the semiconductor die 102 to reduce high etch rates at the entrance and exit edges of the exposed surface 106. It should further be noted that as the etchant flow thins the semiconductor die 102, a step (not shown) is formed between the encapsulant surface 208 and the exposed surface 106 of the semiconductor die, since the etchant has little effect on the encapsulant material 122. This step may cause a fillet to be created at the edges of the exposed surface 106.

In one embodiment, it has been found that the flow of etchant across the exposed surface 106 of the semiconductor die 102 results in chemical thinning of the die 102 at a rate of about 25 micro-meters of silicon per minute.

At block 810, the etching apparatus 308 flows a polishing liquid from one edge 107 of the surface 106, across the surface 106, to the other edge 107 of the surface 106 to polish the surface 106. In one embodiment, the polishing liquid is an acidic liquid comprising a 1:1 nitric acid to hydrofluoric acid mixture and is used to perform a polish, such as a final polish, on the exposed surface 106 of the semiconductor die 102.

Lastly, pursuant to block 812, a rinsing liquid, such as water, is flowed from the pump 312, across the exposed surface 106 of the semiconductor die 102 to rinse etchant, polishing liquid, and any other liquid from the exposed surface 106 and from within the etching apparatus 308. In one embodiment, the exposed surface of the semiconductor die 102 is rinsed three-times with the water.

Optionally, the pump 312 may dispense an amount, such as about 1.5 ml, of nitric acid through the etching apparatus 308 before flowing the rinsing liquid across the exposed surface to remove the etchant mixture and polishing liquid from the etching apparatus 308 and the exposed surface 106 of the semiconductor die 102.

The above detailed description and accompanying drawings are provided to illustrate the specific embodiments of the present invention and are not intended to be limiting. Numerous modifications and variations within the scope of the present invention are possible. The present invention is particularly pointed out and distinctly claimed in the following claims.

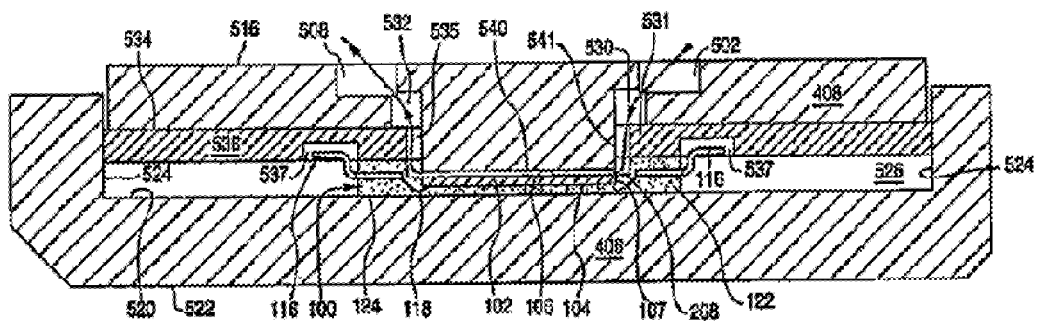

What is claimed is:

1. A method for thinning a semiconductor die at least partially disposed in a semiconductor package, the method comprising:

providing a semiconductor die having opposing active and inactive surfaces, the semiconductor die being disposed in a semiconductor package with the inactive surface being at least partially exposed through a cavity formed in the semiconductor package;

inserting a first surface of a first member into the cavity to form a channel between the first surface of the first member and the inactive surface of the semiconductor die; and flowing an etchant through the channel to etch the inactive surface of the semiconductor die.

2. The method of claim 1, wherein the flowing of the etchant is performed in a sealed chamber.

3. The method of claim 1, wherein the etchant flows across the inactive surface of the semiconductor die at a rate of at least 0.7 meters/second.

4. The method of claim 1, wherein the etchant flows across the inactive surface of the semiconductor die in a turbulent manner.

5. The method of claim 1, further comprising flowing an oxide removing liquid across the inactive surface of the semiconductor die to remove at least a portion of any oxides disposed on the inactive surface, wherein the flowing of the oxide removing liquid precedes the flowing of the etchant.

6. A method for etching a semiconductor die having an exposed surface disposed between first and second edges, the method comprising:

providing an etching assembly including a support member and an adapter member;

positioning the semiconductor die on the support member, the exposed surface of the semiconductor die facing away from the support member;

positioning the adapter member adjacent the exposed surface of the semiconductor die to form a channel between the exposed surface of the semiconductor die and the adapter member; and flowing an etchant through the channel across the exposed surface from the first edge to the second edge to etch the semiconductor die.

7. The method of claim 6, wherein the etchant flows through the channel across the exposed surface at a rate of at least 0.7 meters/second.

8. The method of claim 6, wherein the flow of the flow of the etchant through channel across the exposed surface is turbulent.

9. The method of claim 6, wherein the flowing of the etchant is performed in a sealed chamber formed by the support member and the adapter member.

10. The method of claim 6, further comprising flowing an acidic solution through the channel across the exposed surface from the first edge of the exposed surface to the second edge of the exposed surface to at least partially remove oxide on the exposed surface.

11. The method of claim 6, further comprising flowing an acidic solution through the channel across the exposed surface from the first edge of the exposed surface to the second edge of the exposed surface to at least partially remove oxide on the exposed surface, wherein the acidic solution comprises hydrofluoric acid, the flowing of the acidic solution preceding the flowing of the etchant.

12. The method of claim 6, further comprising flowing an acidic solution through the channel across the exposed surface from the first edge of the exposed surface to the second edge of the exposed surface, wherein the flowing of the acidic solution is subsequent to the flowing of the etchant.

13. The method of claim 6, further comprising flowing an acidic solution through the channel across the exposed surface from the first edge of the exposed surface to the second edge of the exposed surface, wherein the flowing of the acidic solution is subsequent to the flowing of the etchant, wherein the acidic solution comprises hydrofluoric acid and nitric acid.

14. The method of claim 6, wherein the flowing of the etchant farther comprises flowing a layer of etchant through the channel across the exposed surface from the first edge of the exposed surface to the second edge of exposed surface to etch the semiconductor die, the layer having a thickness less than about 0.5 millimeters.

15. The method of claim 6, wherein the semiconductor die further comprises an unexposed surface at least partially disposed within an encapsulant, the exposed surface being exposed through a cavity formed in the encapsulant.

16. The method of claim 6, wherein the etchant comprises a mixture of nitric acid, hydrofluoric acid, and acetic acid.

17. The method of claim 16, further comprising mixing the nitric acid, hydrofluoric acid, and acetic acid in a spherical mixing chamber before flowing the etchant through the channel across the exposed surface of the semiconductor die.

18. A method for etching a semiconductor die having opposing first and second surfaces, the method comprising:

providing an etching assembly including a support member and an adapter member;

positioning the semiconductor die on the support member, the second surface of the semiconductor die facing away from the support member;

positioning the adapter member adjacent the second surface of the semiconductor die to form a channel between the second surface of the semiconductor die and the adapter member;

flowing a first acidic solution through the channel across the second surface of the semiconductor die to at least partially remove oxide on the second surface;

flowing an etchant through the channel across the second surface from a first edge of the second surface to a second edge of the second surface to etch the semiconductor die; and flowing a second acidic solution through the channel across the second surface of the semiconductor die to at least partially polish the second surface of the semiconductor die.

19. The method of claim 18, wherein the etchant comprises a mixture of nitric acid, hydrofluoric acid, and acetic acid.

20. The method of claim 18, wherein the etchant flows through the channel across the second surface of the semiconductor die at a rate of at least 0.7 meters/second.

21. The method of claim 18, wherein the flow of the etchant through the channel across the second surface of the semiconductor die is turbulent.

22. The method of claim 18, wherein the flowing of the etchant is performed in a sealed chamber formed by the support member and the adapter member.

23. The method of claim 18, wherein the first acidic solution comprises hydrofluoric acid.

24. The method of claim 18, wherein the second acidic solution comprises hydrofluoric acid and nitric acid.

25. The method of claim 18, wherein the flowing of the etchant further comprises flowing a layer of etchant through the channel across the second surface of the semiconductor die from the first edge of the second surface to the second edge of the second surface to etch the semiconductor die.

26. The method of claim 18, wherein the first surface of the semiconductor die comprises an unexposed surface disposed within an encapsulant, and the second surface of the semiconductor die comprises an exposed surface being exposed through a cavity formed in the encapsulant.

* * * * *

UNITED STATES PATENT AND TRADEMARK OFFICE
CERTIFICATE OF CORRECTION

PATENT NO.       : 6,723,656 B2
APPLICATION NO. : 09/902931
DATED            : April 20, 2004
INVENTOR(S)      : Kirk Martin It is certified that error appears in the above-identified patent and that said Letters Patent is hereby corrected as shown below:

The title page should be deleted to appear as per attached title page.
The sheets of drawings consisting of figures 1-7 should be deleted to appear as per attached figures 1-7.

Signed and Sealed this

Eighteenth Day of September, 2007

JON W. DUDAS
*Director of the United States Patent and Trademark Office*

(12) United States Patent
Martin

(10) Patent No.: US 6,723,656 B2
(45) Date of Patent: Apr. 20, 2004

(54) METHOD AND APPARATUS FOR ETCHING A SEMICONDUCTOR DIE

(75) Inventor: Kirk Martin, Aptos, CA (US)

(73) Assignee: Nisene Technology Group, Watsonville, CA (US)

(*) Notice: Subject to any disclaimer, the term of this patent is extended or adjusted under 35 U.S.C. 154(b) by 27 days.

(21) Appl. No.: 09/902,931

(22) Filed: Jul. 10, 2001

(65) Prior Publication Data
US 2003/0013317 A1 Jan. 16, 2003

(51) Int. Cl.[7] .................................. H01L 21/302
(52) U.S. Cl. ................. 438/745; 438/106; 438/112; 438/124; 438/748; 438/750
(58) Field of Search ................. 438/106, 112, 438/124, 128, 459, 745, 748, 750, 756

(56) References Cited

U.S. PATENT DOCUMENTS

| | | | |
|---|---|---|---|
| 4,359,360 A | * 11/1982 | Harris et al. | 156/345.18 |
| 4,372,803 A | * 2/1983 | Gigante | 156/345 |
| 5,054,498 A | * 11/1991 | Miller | 438/16 |
| 5,252,179 A | * 10/1993 | Ellerson et al. | 216/90 |
| 5,956,142 A | * 9/1999 | Muller et al. | 356/357 |
| 6,238,936 B1 | * 5/2001 | Yu | 438/7 |

OTHER PUBLICATIONS

Weavers, Barry A., "Chemical Thinning of Silicon for Emission Microscopy Using Multi ETCH—An Introduction," Nisene Technology Group, Inc., B&G International Division, Aug. 2000, pp. 1–6.

Hypervision, "Hypervision's PTFI Portable Test Floor Emission Microscope," Hypervision Inc., 2000, pp. 1–8.

Hypervision, "Sensor and Optics Technology: BEAMS and Mercad Telluride (MCT)", Hypervision Inc., 2000, pp. 1–8.

Hypervision, "Chip UnZip Backside Preparation Tool," Hypervision Inc., 2000, pp. 1–4.

Hypervision, "Chip UnZip: Low Stress Backside Semiconductor Preparation," Hypervision, 1998, pp. 1–4.

Adams, Tom, "Backside Emission Microscopy of Wafers," *News and Analysis @Semiconductor Online*, Feb. 28, 2000, pp. 1–3.

Adams, Tom, "Bringing the Emission Microscope to the Test Floor," *News and Analysis @Semiconductor Online*, Jul. 1, 1999, pp. 1–4.

Hypervision, "BEAMS™ (Backside Emission Analysis Microscope System)", Hypervision Inc., 1998, p. 1.

Clark, Scott, MSCE, "Etching Silicon Dioxide with Aqueous HF Solutions," *Silicon Dioxide Etch*, Bold Technologies, Jan. 29, 2001, pp. 1–5.

Bold Technologies, "Manual Equipment", Bold Technologies, Inc., 1998–2000, pp. 1–3.

Nisene Technology Group, "MultiEtch System," Nisene Technology Group, Inc., Jul. 12, 2000, pp. 1–4.

* cited by examiner

*Primary Examiner*—Lan Vinh
(74) *Attorney, Agent, or Firm*—Patent Law Group LLP; Carmen C. Cook

(57) ABSTRACT

A method and apparatus for etching a semiconductor die are disclosed whereby flowing an etchant material across an inactive thereof thins the semiconductor die. In one embodiment, the etchant includes a mixture of nitric acid, hydrofluoric acid, and acetic acid and turbulently flows from one edge of the semiconductor die, across the inactive surface of the semiconductor die, to an opposing edge of the semiconductor die.

26 Claims, 7 Drawing Sheets